United States Patent [19]

Okabe et al.

[11] 4,172,260

[45] Oct. 23, 1979

[54] INSULATED GATE FIELD EFFECT TRANSISTOR WITH SOURCE FIELD SHIELD EXTENDING OVER MULTIPLE REGION CHANNEL

[75] Inventors: Takeaki Okabe, Kokubunji; Isao Yoshida, Tokyo; Shikayuki Ochi, Akishima; Hidefumi Itoh, Takasaki; Masatomo Furumi, Fuchu; Toru Toyabe; Mineo Katsueda, both of Kokubunji; Yukio Shirota, Toyokawa, all of Japan

[73] Assignee: Hitachi, Ltd., Japan

[21] Appl. No.: 853,548

[22] Filed: Nov. 21, 1977

[30] Foreign Application Priority Data

Dec. 1, 1976 [JP] Japan .................... 51-143349

[51] Int. Cl.² ............................................. H01L 29/78
[52] U.S. Cl. ........................................ 357/23; 357/51; 357/53; 357/54; 357/89; 357/91
[58] Field of Search ................. 357/23, 53, 89, 51, 357/91, 54

[56] References Cited

FOREIGN PATENT DOCUMENTS

| 50-114182 | 9/1975 | Japan | 357/23 |
| 51-93878 | 8/1976 | Japan | 357/23 |
| 52-65682 | 5/1977 | Japan | 357/23 |

OTHER PUBLICATIONS

P. Krick et al., "Integratable, Symmetrical, High-Voltage MOSFET Structure", IBM Tech. Discl. Bull., vol. 15 #6, Nov. 1972, pp. 1184, 1185.

I. Yoshida et al., "Device Design of an Ion-Implanted High Voltage MOSFET, " J. Jap. Soc. of Appl. Phys., vol. 44, 1975, pp. 249-255.

Primary Examiner—Joseph E. Clawson, Jr.
Attorney, Agent, or Firm—Craig and Antonelli

[57] ABSTRACT

In an insulated gate field effect transistor having a source region and a drain region of the P-conductivity type which are disposed in surface portions of a semiconductor substrate of the N-conductivity type in a manner to be spaced apart from each other, a gate electrode being disposed through an insulating film on the substrate between the source region and the drain region, an insulated gate field effect transistor wherein said drain region is disposed apart from said gate electrode, two regions of an intermediate region and a high resistance region which are of the P-conductivity type and which successively extend from said drain region towards the side of said gate electrode are disposed in surface portions of the substrate situated between said drain region and said gate electrode, said intermediate region having an impurity concentration lower than that of said drain region, said high resistance region having an impurity concentration lower than that of said intermediate region, and a source electrode extends over and beyond said gate electrode and said high resistance region through said insulating film and terminates over said intermediate region.

11 Claims, 18 Drawing Figures

4,172,260

INSULATED GATE FIELD EFFECT TRANSISTOR WITH SOURCE FIELD SHIELD EXTENDING OVER MULTIPLE REGION CHANNEL

BACKGROUND OF THE INVENTION

1. Field of the Invention

This invention relates to field effect transistors, and more particularly to transistor structures of the type known as insulated gate field effect transistors.

2. Description of the Prior Art

Recently, various efforts have been made to increase the drain breakdown voltages of insulated gate field effect transistors (hereinafter, briefly referred to as MIS-FET's), and some kinds of high voltage MIS-FET's have been obtained. In improving the high breakdown voltage of the MIS-FET in the prior art, it has been known to be effective if the offset gate structure with an ion-implanted additional channel (or a resistor region) is employed. (Proceedings of the 6th Conference on Solid State Devices, Tokyo, 1974, Supplement to the Journal of Japan Society of Applied Physics, Vol. 44, 1975, pp. 249–255)

FIG. 1 of the accompanying drawings shows a cross section of the high voltage MIS-FET with the ion-implanted offset gate structure.

The MIS-FET in FIG. 1 is a P-channel MIS-FET taken as an example. Numeral 1 designates an N-conductivity type semiconductor substrate. Numerals 2 and 3 designate highly doped P-conductivity type drain and source regions, respectively. Numeral 5 indicates a gate electrode, and numerals 6 and 7 indicate a source electrode and a drain electrode, respectively. Shown at 8 is a silicon dioxide ($SiO_2$) film. A resistor region 4 having the same conductivity type as that of the drain region 2 is extended and formed from the drain region 2 to underneath an end of the gate electrode 5 in order to lower the strength of an electric field at the end part of the gate electrode 5 as lies on the side of the drain region 2 and to thus enhance the drain breakdown voltage.

With the structure of FIG. 1, however, the reduction of the field strength at the end of the gate electrode is not satisfactory under the influence of the process of charging onto the $SiO_2$ film 8 overlying the portion of the resistor region 4. In order to solve this drawback, there has been developed a method wherein, as illustrated in FIG. 2 or FIG. 3, the source electrode 6 is extended on the $SiO_2$ film 8 to an intermediate part of the drain region 2 or the resistor region 4 and it is used as a field plate (electric field moderating electrode) [Japanese Laying-open of Patent Application No. 50-114182 (laid open Sept. 6, 1975), No. 52-65682 (laid open May 31, 1977)]. Another example of the source field plate (SFP) has been known from Japanese Laying-open No. 51-93878 (laid open Aug. 17, 1976).

The field plate shown in FIG. 2, however, incurs a field crowding to an end part of the drain region 2 as lies on the side of the gate electrode 5. Accordingly, it conversely presents a lowering of the breakdown voltage to the drain region. On the other hand, when the field plate is confined up to the intermediate part of the resistor region 4 as shown in FIG. 3, the degradation of the drain breakdown voltage can really be prevented. Disadvantageously, however, part of the resistor layer 4 is prone to be affected by the process of charging onto the insulating film 8, and the fluctuations of characteristics are easily brought about.

SUMMARY OF THE INVENTION

It is accordingly an object of this invention to eliminate the disadvantages stated above and to provide a MIS-FET of high breakdown voltage and high reliability.

To this end, the present invention constructs a high voltage MIS-FET in such a way that the offset gate structure in which a drain region and a gate electrode are disposed apart from each other is adopted, that two regions which are the same in the conductivity type as the drain region but are different in the impurity concentration from the drain region and which extend from the drain region to beneath the end of the gate electrode close to the drain region in succession, i.e., an intermediate region which has an impurity concentration lower than that of the drain region and a resistor region which has an impurity concentration lower than that of the intermediate region are formed, and that a source electrode is extended on an insulating film to over the intermediate region and used as a source field plate (SFP).

DESCRIPTION OF THE PREFERRED EMBODIMENTS

Figure 4:
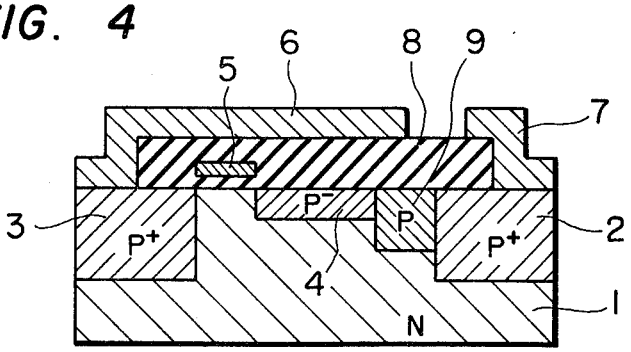
FIG. 4 shows a sectional structure of a high voltage MIS-FET according to a first embodiment of this invention.

Embodiment 1:

FIG. 4 is a diagram which shows a sectional structure of a P-channel high voltage MIS-FET according to an embodiment of this invention.

Figure 2:
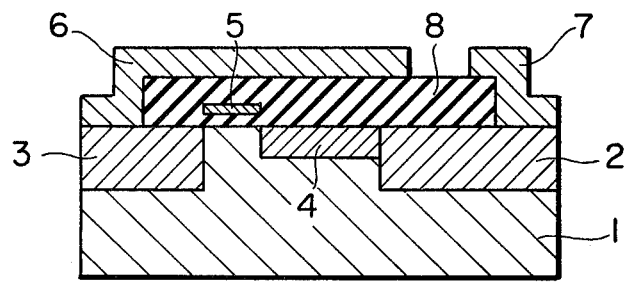
FIGS. 2 and 3 show sectional structures of prior-art high voltage MIS-FET's, particularly MIS-FET's in which the MIS-FET in FIG. 1 is provided with source field plates.
Figure 3:
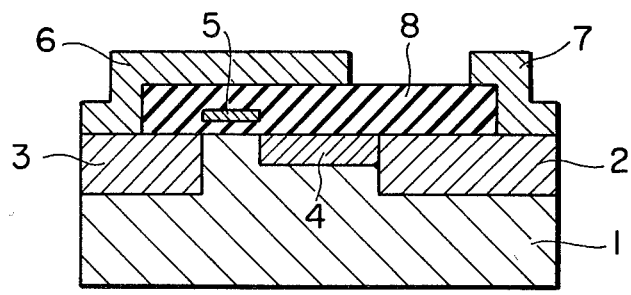

This embodiment is such that, in the MIS-FET illustrated in FIG. 2 or FIG. 3, an intermediate region 9 which has an impurity concentration intermediate between those of the drain region 2 and the resistor region 4 is disposed between the drain region 2 and the resistor region 4, the field plate 6 being terminated over the intermediate region 9.

Now, the manufacturing process of this MIS-FET will be described with reference to FIGS. 5A to 5F.

Figure 5A:
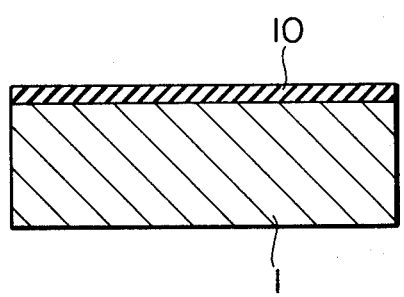
FIGS. 5A to 5F elucidate a manufacturing process of the MIS-FET shown in FIG. 4, and illustrate sectional structures of the element at respective manufacturing steps.
Figure 5B:
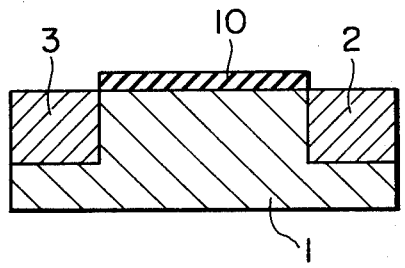
Figure 5C:
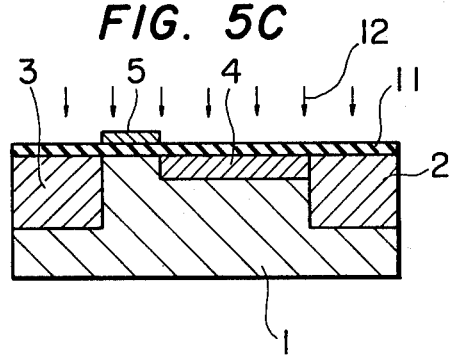

An N-type silicon substrate having a resistivity of 10Ω. cm is used as a semiconductor substrate, and a thermally oxidized $SiO_2$ film 10 is formed thereon to a thickness of about 5,000 Å (FIG. 5A). By selectively removing the $SiO_2$ film 10 with the well-known photo-etching technique and thereafter diffusing boron into the substrate 1, a drain region 2 and a source region 3 having a P-type high impurity concentration are formed to a depth of approximately 3 μm (FIG. 5B). After removing the $SiO_2$ film 10 between the drain and source regions, an $SiO_2$ film 11 having a thickness of about 1,300 Å is formed by conducting the thermal oxidation again. Further, a polycrystalline silicon layer is deposited on the $SiO_2$ film 11 to a thickness of about 5,000 Å, and a gate electrode 5 is formed by selectively etching the polycrystalline silicon layer. Subsequently, using the gate electrode 5 as a mask, boron ions 12 are implanted by accelerating them to 125 KV, to form a resistor region 4 of low impurity concentration (FIG. 5C). At this time, the implanted quantity $N_{DT}$ of boron is an important parameter to determine the breakdown voltage and has been been $8 \times 10^{11} - 2 \times 10^{12}$ ions/cm$^2$ in the present embodiment.

Figure 5D:
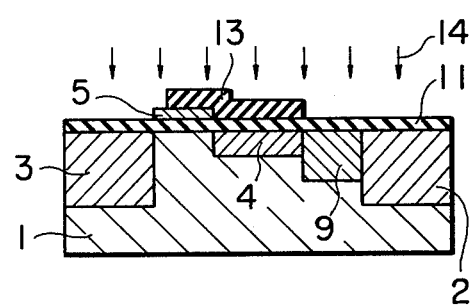
Figure 5E:
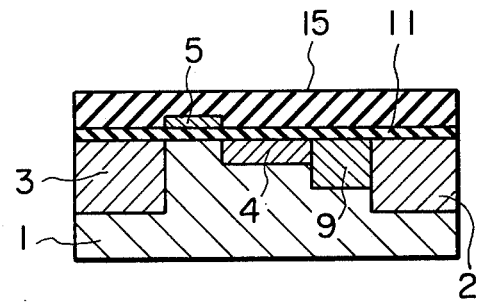
Figure 5F:
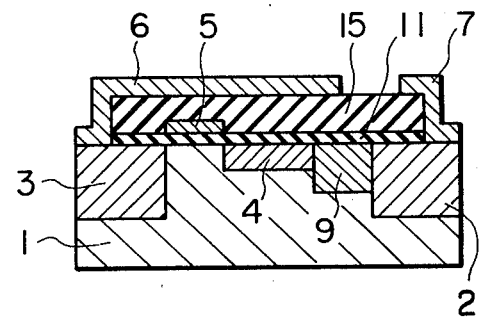

Subsequently, an $SiO_2$ film 13 which extends from on the gate electrode 5 onto the $SiO_2$ film 11 and which terminates at an intermediate position of the resistor layer 4 is formed at a selected area. Using the gate electrode 5 and the $SiO_2$ film 13 as a mask, boron ions 14 are implanted by accelerating them to 150 KV, to form an intermediate region 9 of an implanted quantity of $3 \times 10^{13}$ ions/cm$^2$ between the drain region 2 and the resistor layer 4 (FIG. 5D). After removing the $SiO_2$ film 13, an $SiO_2/P_2O_5$ (phosphosilicate glass) film 15 serving as a passivation film is formed to a thickness of approximately 1 μm (FIG. 5E). The annealing of the implanted layer and the phosphosilicate glass film is carried out at 950° C. in $N_2$ for 30 minutes. Subsequently, the phosphosilicate glass film 15 and the $SiO_2$ film 11 are etched to provide holes for leading out electrodes, and aluminum is deposited to a thickness of approximately 1.2 μm. Thus, a source electrode 6 which extends from the source region 3 onto the phosphosilicate glass film 15 and reaches a part over an intermediate position of the intermediate region 9 is formed, and a drain electrode 7 is also formed (FIG. 5F). Regarding the dimensions of the respective regions, the width of the gate electrode is 8 μm, the width of the resistor region 4 is 5 μm, and the width of the intermediate region 9 is 4 μm.

As described above, the source electrode 6 terminates just over the intermediate region 9. As a field plate, it functions as a passivation layer for the resistor region 4. The impurity concentration of the intermediate region 9 is $\sim 2 \times 10^{16}$ cm$^{-3}$, which is above two orders lower than the impurity concentration $\sim 6 \times 10^{19}$ cm$^{-3}$ of the drain region 2. Therefore, the degradation of the breakdown voltage attributed to the source field plate is not observed. In addition, the impurity concentration of the intermediate region 9 as represented in terms of the total impurity quantity is roughly one order higher than the corresponding impurity concentration of the resistor region 4 (the implanted quantity of boron of the former region 9 is one order larger than that of the latter region 4). Therefore, the intermediate region 9 does not affect the series resistance and is less susceptible to the external charging process.

Figure 1:
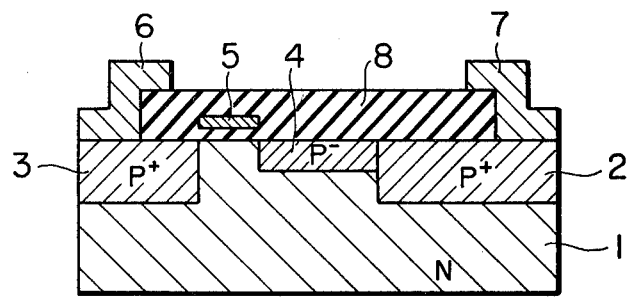
FIG. 1 shows a sectional structure of a prior-art high voltage MIS-FET, particularly a MIS-FET having an ion-implanted offset gate structure.
Figure 6:
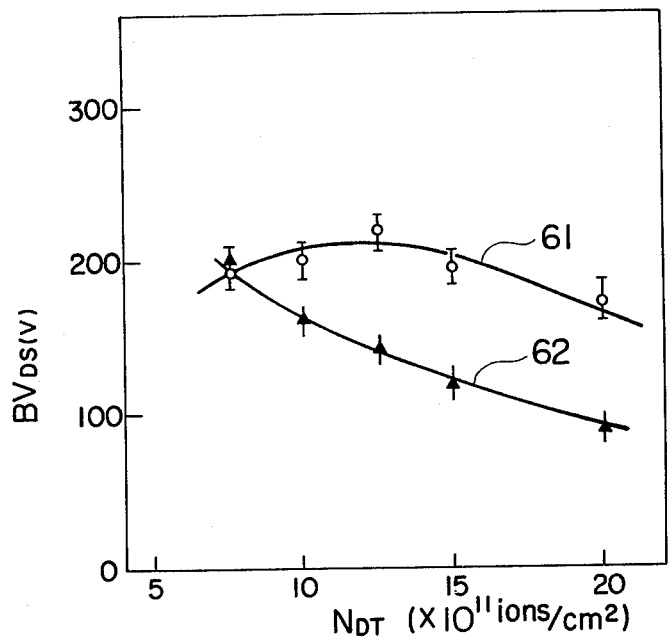
FIG. 6 is a diagram showing the relationship between the drain breakdown voltage and the implanted quantity of boron ions in the MIS-FET of FIG. 4.

The relationship between the drain breakdown voltage $BV_{DS}$ of the MIS-FET and the implanted quantity of boron $N_{DT}$ of the high resistance region 4 as obtained in the present embodiment is illustrated by 61 in FIG. 6. In the figure, the drain breakdown voltage of the MIS-FET of the prior-art structure shown in FIG. 1 is also illustrated at 62 for reference. It is understood from the figure that the MIS-FET of this invention has been improved in point of the breakdown voltage over the MIS-FET of the prior-art structure. Moreover, owing to the absence of the influence of the external charging process, the fluctuations of the breakdown voltage (for example, the walk-out effect) during measurement as observed in the FET of the prior-art structure were not observed.

As set forth above, according to this invention, the electric field crowding in the vicinity of the end of the gate electrode is moderated by the field plate effect of the source electrode, the resistor layer is protected from the external charging process by the source electrode, and yet, the lowering of the breakdown voltage due to the source field plate can be avoided, so that a high breakdown voltage and stable MIS-FET can be fabricated.

Figure 7:
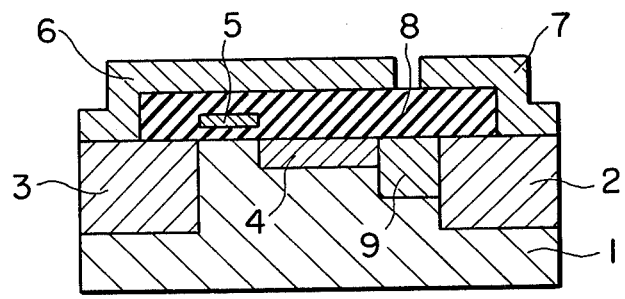
FIG. 7 is a structural sectional view of a high voltage MIS-FET according to a second embodiment of this invention.

Embodiment 2:

FIG. 7 is a view showing a sectional structure of another embodiment of this invention. This embodiment can be produced by the same process as that of the preceding embodiment. Different from the preceding embodiment is that both the source electrode 6 and the drain electrode 7 are terminated over the intermediate region 9 and that the drain electrode 7 is utilized as a field plate for the drain region 2. In this case, besides the foregoing advantages, the advantage of an enhancement in the breakdown voltage is brought forth in case where the breakdown voltage is determined in the vicinity of the boundary between the drain region 2 and the intermediate region 9. In the present embodiment, the breakdown voltage has been enhanced about 20 V with respect to that in the preceding embodiment.

Figure 8:
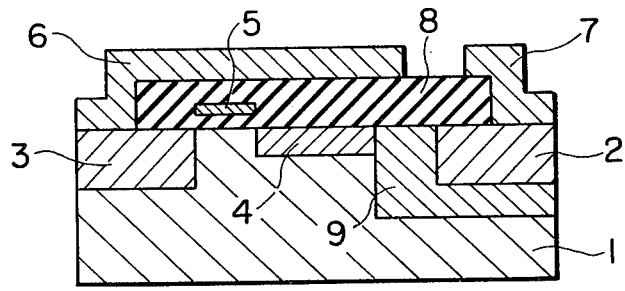
FIG. 8 is a structural sectional view of a high voltage MIS-FET according to a third embodiment of this invention.

Embodiment 3:

FIG. 8 is a view showing a sectional structure of still another embodiment of this invention. This embodiment is such that, instead of disposing the drain region 2 and the intermediate region 9 in adjacency as in Embodiment 1, the drain region 2 is disposed within the intermediate region 9.

The manufacturing process of the present embodiment will be described with reference to FIGS. 9A to 9E.

Figure 9A:
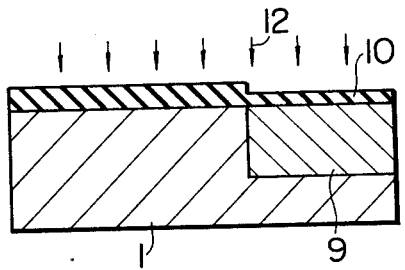
FIGS. 9A to 9E elucidate a manufacturing process of the MIS-FET shown in FIG. 8, and illustrate sectional structures of the element at respective manufacturing steps.
Figure 9D:
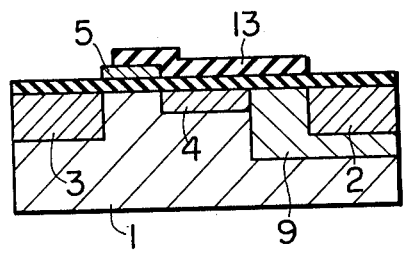
Figure 9B:
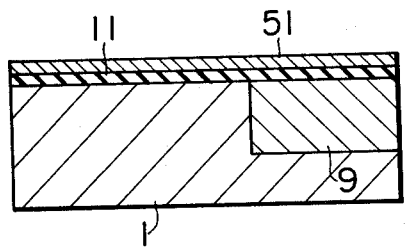
Figure 9E:
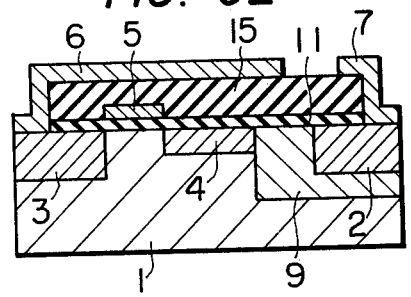
Figure 9C:
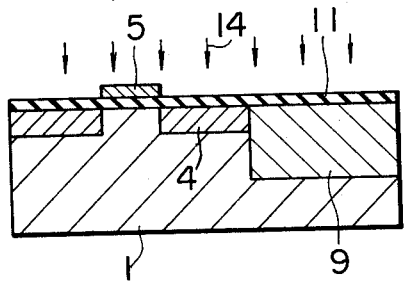

After forming an $SiO_2$ film 10 into a step shape on an N-type silicon substrate 1, boron ions 12 are implanted and further the thermal diffusion is carried out, to form an intermediate region 9 (FIG. 9A). After removing the $SiO_2$ film 10, an $SiO_2$ film 11 is formed by the thermal oxidation. Further, a polycrystalline silicon layer 51 is deposited on the $SiO_2$ film 11 (FIG. 9B). By selectively etching the polycrystalline silicon layer 51, a gate electrode 5 is formed. Thereafter, using the gate electrode 5 as a mask, boron ions 14 are implanted to form a resistor region 4 (FIG. 9C). Subsequently, an $SiO_2$ film 13 which extends from on the gate electrode 5 onto the $SiO_2$ film 11 and which terminates at a part over an intermediate position of the intermediate region 9 is formed at a selected area. Thereafter, using the $SiO_2$ film 13 and the gate electrode 5 as a mask, the diffusion of boron is executed to form a source region 3 and a drain region 2 within the intermediate region 9 (FIG. 9D). Thereafter, a phosphosilicate glass film 15 and a source electrode 6 as well as a drain electrode 7 are formed by the same steps as in Embodiment 1 (FIG. 9E).

In the FET of the present embodiment, the end part of the drain region 2 is included within the intermediate region 9. Therefore, the breakdown voltage of a p-n junction is determined by the end of the intermediate region 9 and becomes greater than those in Embodiments 1 and 2. In case of the present embodiment, a value of 240 V was obtained as the breakdown voltage of the p-n junction, but the drain breakdown voltage of the MIS-FET was limited by another part and was 210 V or so. Anyway, the present embodiment is a very excellent structure for high voltage MIS-FET's.

As described above, in accordance with this invention, high breakdown voltage and high stability MIS-FET's can be readily provided.

It is apparent that the invention is not limited to the foregoing examples but numerous modifications thereof may be made without departing from the true spirit of the invention.

For example, the known semiconductor such as Ge, GaAs, InP and InSb may be used instead of Si for the semiconductor substrate. In the foregoing embodiments, an $SiO_2$ film is used for the insulation film on the semi-conductor substrate and $SiO_2/P_2O_5$ film is used for the passivation film. Instead, an $Si_3N_4$ film, $Al_2O_3$ film, $SiO_2/P_2O_5$ (phosphosilicate glass) film, $SiO_2/PbO$ (lead-silicate glass) film, $SiO_2/B_2O_5$ (boronsilicate glass) film, a double film formed by combining two films such as $SiO_2$ and $SiO_2/P_2O_5$ films, $SiO_2$ and $Al_2O_3$ films, etc. may be used.

Also, a metal such as Mo or Al be used instead of polycrystalline silicon for the gate electrode. When polycrystalline silicon is used for the gate electrode, the threshold voltage of the insulated gate field effect transistor can be controlled by suitably adding an impurity to the silicon layer.

While we have shown and described several embodiments in accordance with the present invention, it is understood that the same is not limited thereto but is susceptible of numerous changes and modifications as known to those skilled in the art and we therefore do not want to be limited to the details shown and described herein, but intend to cover all such changes and modifications as are within the scope of the appended claims.

What is claimed is:

1. An insulated gate field effect transistor comprising:
   a semiconductor substrate of a first conductivity type;
   a source region of a second conductivity type, opposite said first conductivity type, disposed in a first surface portion of said substrate;
   a resistor region of said second conductivity type disposed in a second surface portion of said substrate spaced apart from said source region by a third surface portion of said substrate between;
   an intermediate region of said second conductivity type having an impurity concentration higher than that of said resistor region and disposed in a fourth surface portion of said substrate contiguous to said second surface portion;
   a drain region of said second conductivity type having an impurity concentration higher than that of said intermediate region and disposed in a fifth surface portion of said substrate contiguous to said fourth surface portion;
   a first insulating film disposed on said substrate between said source and resistor regions;
   a gate electrode disposed on said first insulating film;
   a second insulating film disposed on at least said gate electrode, said second surface portion, and said fourth surface portion;
   a drain electrode connected to said drain region; and
   a source electrode connected to said source region, extending on said second insulating film, covering said gate electrode, said resistor region, and a part of said intermediate region, so that one edge of said source electrode is located above said intermediate region.

2. An insulated gate field effect transistor according to claim 1, wherein said second insulating film is further disposed on a part of said fifth surface portion, and said drain electrode extends on said second insulating film and covers a part of said drain region and a part of said intermediate region, so that one edge of said drain electrode is located above said intermediate region.

3. An insulated gate field effect transistor according to claim 1, wherein said fifth surface portion is including in said fourth surface portion, so that said drain region is disposed in said intermediate region.

4. An insulated gate field effect transistor according to claim 3, wherein a depth of said intermediate region in said substrate is greater than a depth of said drain region in said intermediate region.

5. An insulated gate field effect transistor according to claim 1, wherein said gate electrode, source electrode, and drain electrode are made of a material selected from the group consisting of metals and semiconductor materials.

6. An insulated gate field effect transistor according to claim 1, said first and second insulating films are made of a film selected from the group consisting of $SiO_2$, $Si_3N_4$, $Al_2O_3$, $SiO_2/PbO$(leadsilicate glass), $SiO_2/P_2O_5$ (phosphosilicate glass), $SiO_2/P_2o_5$(boronsilicate glass) films, and double layer films formed of a combination of two of these films.

7. An insulated gate field effect transistor according to claim 1, wherein said semiconductor substrate is a semiconductor from the group consisting of semiconductors Si, Ge, GaAs, InP, and InSb.

8. An insulated gate field effect transistor according to claim 1, wherein an impurity concentration of said drain region is as same as that of said source region.

9. An insulated gate field effect transistor according to claim 8, wherein an impurity concentration of said intermediate region is lower than $10^{-2}$ times that of said drain region.

10. An insulated gate field effect transistor according to claim 9, wherein a total impurity quantity of said resistor region is lower than $10^{-1}$ times that of said intermediate region.

11. An insulated gate field effect transistor comprising:
    a semiconductor substrate of a first conductivity type;
    a source region of a second conductivity type, opposite said first conductivity type, disposed in a first surface portion of said substrate;
    a resistor region of said second conductivity type disposed in a second surface portion of said substrate spaced apart from said source region by a third surface portion of said substrate between;
    an intermediate region of said second conductivity type having an impurity concentration higher than that of said resistor region and disposed in a fourth surface portion of said substrate contiguous to said second surface portion;

a drain region of said second conductivity type having an impurity concentration higher than that of said intermediate region and disposed in a fifth surface portion of said substrate contiguous to said fourth surface portion;
a first insulating film disposed on said substrate between said source and resistor regions;
a gate electrode disposed on said first insulating film;

a drain electrode connected to said drain region; and
a source electrode connected to said source region, extending over said gate electrode, said resistor region, and a part of said intermediate region, and electrically insulated by a insulating film therefrom, so that one edge of said source electrode is located above said intermediate region.

* * * * *